United States Patent [19]

Reinhardt

[11] Patent Number: 4,710,853
[45] Date of Patent: Dec. 1, 1987

[54] ASSEMBLY FOR MOUNTED COMPONENTS WITH SNAP-ACTION

[76] Inventor: Rudolf Reinhardt, Markt-Schwabener-Strasse 2, D-8059 Finsing, Fed. Rep. of Germany

[21] Appl. No.: 765,336

[22] Filed: Aug. 13, 1985

[30] Foreign Application Priority Data

Aug. 14, 1984 [DE] Fed. Rep. of Germany ....... 3429894

[51] Int. Cl.$^4$ ............................................ H05K 7/14
[52] U.S. Cl. .................... 361/391; 206/821; 220/DIG. 25; 220/4 R; 220/72; 361/380; 361/399; 361/417; 361/419
[58] Field of Search .............. 206/821; 241/41; 220/DIG. 25, 4 R, 72; 361/380, 334, 390–396, 399, 417–420; 339/17 M, 17 LM, 198 G, 198 GA

[56] References Cited

U.S. PATENT DOCUMENTS

| | | | |
|---|---|---|---|
| 3,309,577 | 3/1967 | Roll, Jr. ............................ | 361/391 |
| 3,463,967 | 8/1969 | Klein ................................ | 361/353 |
| 4,111,328 | 9/1978 | Eggert et al. .................... | 220/4 R |
| 4,251,851 | 2/1981 | Diersing et al. ................. | 361/353 |
| 4,423,465 | 12/1983 | Teng-Ching et al. ........... | 361/394 |
| 4,471,898 | 9/1984 | Parker ............................... | 361/394 |
| 4,525,771 | 6/1985 | Hanseler et al. ................. | 361/415 |

FOREIGN PATENT DOCUMENTS

| | | | |
|---|---|---|---|
| 2229173 | 1/1974 | Fed. Rep. of Germany ...... | 361/380 |
| 2711973 | 9/1978 | Fed. Rep. of Germany ...... | 361/393 |

Primary Examiner—A. D. Pellinen
Assistant Examiner—Gregory D. Thompson
Attorney, Agent, or Firm—Jacobs & Jacobs

[57] ABSTRACT

A structural assembly for interchangeably and supportably mounting electrical components of the type having snap-action mounts includes a pair of longitudinally-extending slide rails integral with a base wall of a housing. The slide rails have snap-fastening elements situated above the base wall, and bounding therewith channels in which the snap-action mounts are lockingly received with snap-action. Longitudinal grooves are provided on outer and interior surfaces of the base wall, as well as on side and end walls of the housing for receiving additional assembly parts.

12 Claims, 4 Drawing Figures

ASSEMBLY FOR MOUNTED COMPONENTS WITH SNAP-ACTION

BACKGROUND OF THE INVENTION

The invention relates to a housing for receiving electrical and structural elements (components). The housing is slide into a so called "19-inch-apparatus" system. The housing has an extruded U-profile configuration, and is provided on its opposing, parallel side walls with grooves for the fastening of plate-shaped members and sheets.

DESCRIPTION OF THE PRIOR ART

Elongated housings are known, which receive a plurality of electric sockets arranged in series adjacent one another as well as switches, control lamps and the like. Such housings are adapted to be divided longitudinally and, hence, consist of an upper and a lower trough-shaped housing half, within which respectively a part of the plugs is held. The two housing halves are held together by means of screws, which at the same time connect together the plug parts.

The known main housings may be provided with additional housings for receiving necessary electrical and structural elements and their wiring. The additional housings can be connected to the main housings with the aid of detent connections, so that the connections required for the respective switching (control) purpose can be established between the standard structural elements of the main housing and the electrical, structural and switching elements of the additional housing.

Furthermore, empty (intermediate) housings are known for receiving in ½ and ¼ division, electric equipment which must be attached to special assembly devices, such as guide rails, cable chutes, assembly planes, such equipment must be produced separately and must be secured separately in the empty (intermediate) housing. Consequently, such commercially available, so-called system-mains supply slide-in means can be utilized only after adaptation to the respectively desired electric structure to be built-in. This adaptation requires time-consuming and costly manual work, even though the above-mentioned built-in elements, hence, e.g. assembly planes, cable chutes and guide rails, are available.

In a known housing of the type mentioned at the outset the grooves on the opposing, parallel side walls of the slide-in housing serve for the mounting of printed circuit boards. Hence, a reduction in the assembly effort is admittedly attained in the case of this housing by the fact that the printed circuit boards can be simply slid into the grooves for the purpose of being installed in the housing, whereupon the housing is slid into the apparatus system. On the other hand, this design does not make it possible to exchange the printed circuit boards, as the printed circuit boards can be removed only via the two open lateral sides of the slide-in housing. The housing must for this purpose be disassembled from the apparatus system. Moreover, the known housing is not universally utilizeable either, particularly not in conjunction with other electric or structural elements for which no mountings whatsoever are provided. Hence, the housing would first need to be equipped to conform to the purpose of use, for example by screw-mounting particular mounting rails, which are respectively adapted to the configurations predetermined by the electric or structural parts which are to be installed.

However, even in a case where mounts for electric or structural elements other than printed circuit boards are utilized in conjunction with the known housing, then that would not guarantee that the structural elements, for example automatic cut-out means, plugs, switching relays, resistances, capacitors or the like, can be removed again any time after they have been secured in the housing if it should become necessary to exchange them without needing to remove the slide-in housing as a whole from its position of assembly in the apparatus system.

SUMMARY OF THE PRESENT INVENTION

One object of the invention is, therefore, to further reduce the effort of production and assembly of such housings.

Still a further object is to assemble at any time all conventional electric or structural elements on the housing, without requiring the housing, once it has been slid into the apparatus system and fastened in its slid-in position, to be disassembled from the apparatus system again.

According to the invention, these and other objects are accomplished in that a U-profile housing is provided on the inner side of its bottom wall, to which its side walls are contiguous, with at least one profile rail extending in longitudinal direction and having lateral snap-fastening elements through which it is possible, to releasably and interchangeably fasten electrical and/or structural components, such as automatic cut-outs, sockets, switching relays, resistances or the like in the housing by means of slipping the components on and locking them in the profile rail.

By this design of the housing it is not only attained that the assembly planes, cable chutes and guide rails are a component part of the inner side of the bottom of the extruded U-profile housing but also, the snap-fastening elements can support the most varying electric and structural elements, which may be inserted into the housing before the housing is installed in the apparatus system. Also, after said housing has been installed, an exchange of the electric and structural elements is possible at any time it becomes necessary, without the housing needing to be disassembled from the apparatus system. Therefore, this type of construction of the housing leads not only to a substantial reduction in the manufacturing costs and the effort of assembly because it makes separate mounting and guiding elements superfluous, but also leads to a quick exchange of electric and structural elements which have become defective or unserviceable. Costly shut-down times of connected electric machines and apparatus are avoided in that way, and, line-up errors in equipping the housing with the electric and structural elements can also be eliminated much more easily. In any event, no disassembly of the housing is required for that purpose after such a housing has been installed in a corresponding apparatus system.

BRIEF DESCRIPTION OF THE DRAWINGS

The invention is explained in more detail below by way of the exemplary embodiments shown in the drawings.

DETAILED DESCRIPTION OF THE PREFERRED EMBODIMENTS

Figure 1:
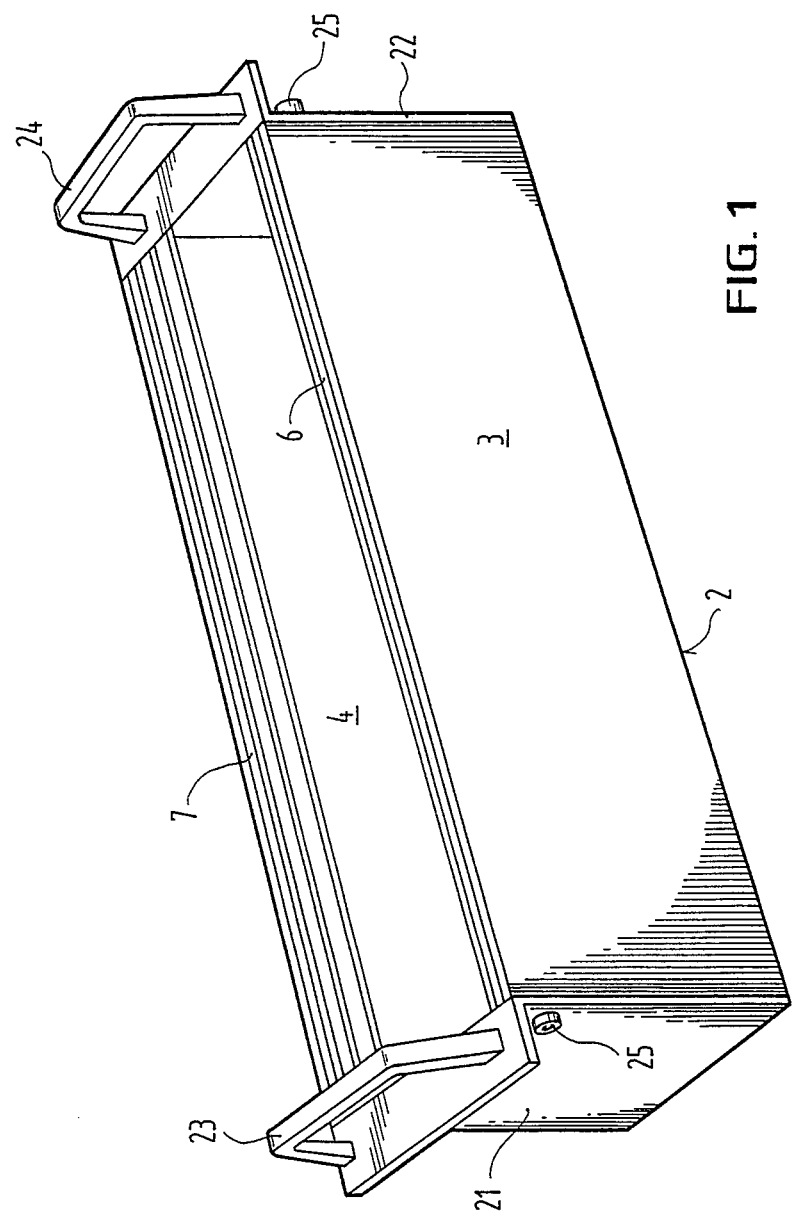
FIG. 1 is a perspective view of the housing according to the invention, the electric and structural parts having been omitted.

The housing 1 shown in FIG. 1 for receiving electrical structural elements is for use as a slide-in housing for installation in a so-called "19-inch-apparatus" system and has a U-profile. The housing 1 includes parallel side walls 3 and 4 opposing one another at a spacing and a base or bottom wall 2 as well as front and rear end walls 21 and 22 which are screw-attached to the ends of said housing at 25. The upper ends of the end walls are bent outwardly to form ears on which handles 23 and 24 are mounted. Hence, the outside dimensions of this housing are designed to fit into the apparatus system.

The bottom wall 2 as well as the two side walls 3 and 4 are provided with grooves for the attachment and guidance of electric and mechanical structural elements, such as will be explained in detail below. These grooves hence form a part of the extruded housing 1 consisting of aluminum and are adapted in respect of their configuration to the respective purpose of use.

On the inner side 10 of the bottom wall 2 there are disposed two parallel profile rails 5 extending in longitudinal direction along the elongation of the housing 1. The rails serve as snap-fastening elements for the electric and structural elements to be fastened on said inner side. For example switches, sockets, fuses, resistances or the like are representative of such a structural element which is shown diagrammatically in dotted lines at 11 in FIG. 2. The snap-fastening elements 12 form the lateral edges of the profile rails and snap into resilient walls bounding recesses 43, 44 located on the bottom of the particular electric or structural element 11 when said element 11 is pressed onto the profile rails. On the other hand, in the case the elements 11 are not deformable at their bottom sides in a manner so as to be able to be snap-attached to the profile rail, it is possible to provide said profile rail along the length thereof with interruptions for the assembly and disassembly of such elements. This makes it possible to slide the elements 11 laterally onto the rails. In this case, such elements 11, after they have been slid onto said profile rails, could be prevented with the aid of deformable synthetic material supports, which are clamp-attached on either side of the rail, from being displaced by themselves on said profile rail.

Hence, with the aid of said profile rail 5 and its snap-fastening elements 12 there is provided the possiblity, in the case of corresponding deformable electric or structural elements, of readily inserting and removing said elements 11 even after the housing has been installed in the apparatus system. The housing must, therefore, be disassembled for this purpose and removed from the system. Grooves 6, 7 are formed by top wall portions bounding the same on the inner sides 13 and 14 of the side walls 3, 4, the grooves extending in longitudinal direction and being disposed on front profile member edges 28 and 29, where the grooves 6, 7 open to the front. These grooves serve for the attachment of one or more front plates or cover plates 43. Such plates 43 close the housing across the top and are either designed as a closed or a perforated cover. This renders the elements 11 which are located in the housing on the profile rails 5 accessible.

Such wall portions bound further grooves 8, 9 on the inner sides 13, 14, which likewise extend in longitudinal direction, form passageways, which serve with the aid of the screws shown at 25 in FIG. 1 for the attachment of the plate-configured end walls 21 and 22. The end walls laterally close the housing 1. The end walls are provided with handles 23, 24. Furthermore, corner wall portions founding parallel chute passageways 26, 27 for the wiring 50, 51 of the elements 11 are provided on the inner side of the bottom plate 2 in he proximity of the inner sides 13, 14 of the side walls 3, 4.

The bottom plate 2 is provided on its outer side 20 with grooves 17, 18 extending in longitudinal direction. The grooves 17, 18 are undercut and serve to receive retaining screws for the attachment of angle members and for the attachment of two such housings together on their bottom sides.

Figure 3:
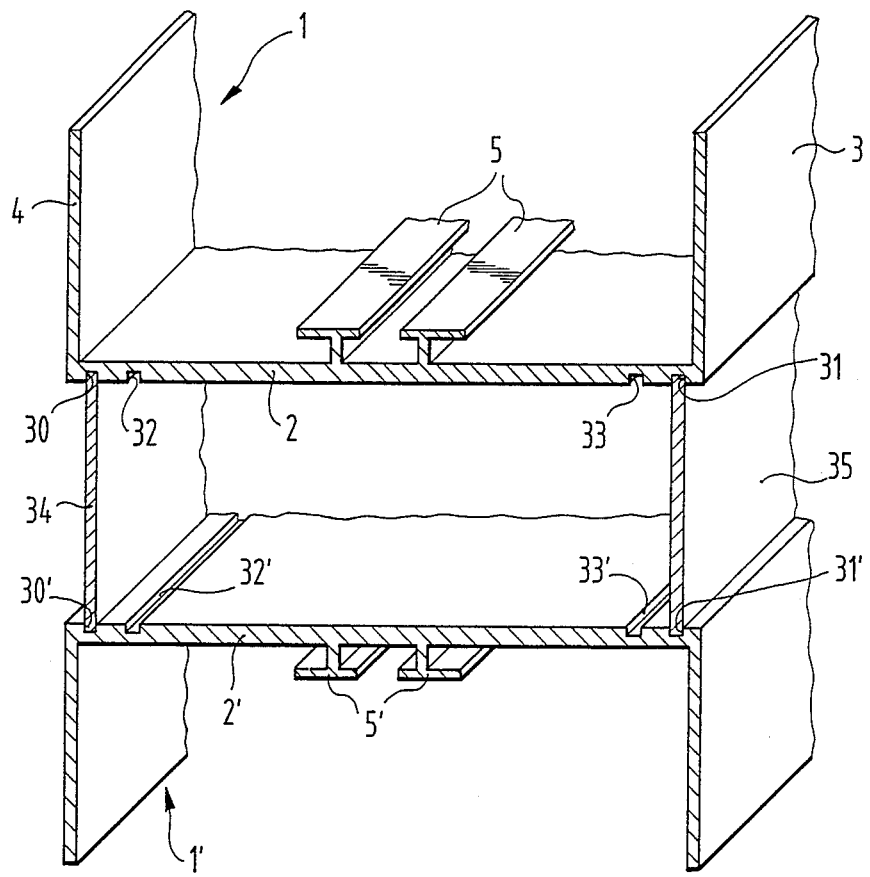
FIG. 3 is a partial sectional view in perspective of two U-profile housing assembled at facing base walls with the aid of connecting plates and FIG. 4 is a partial sectional view in perspective of a U-profile housing, which is connected at its base wall to a known slide-in support.

The outer side 20 of the bottom wall 2 includes outer base wall portions bounding further longitudinal grooves 30, 31, 32, 33 in its marginal regions, into which grooves it is possible to insert, as may be seen in FIG. 3, connecting or covering sheets or plates 34, 35, whose opposing ends engage in the corresponding longitudinal grooves 30', 31', 32', 33' of a second U-profile housing 1' of like dimensions being arranged in mirror-inverted manner relative to the U-profile housing 1 and connect the two U-profile housings together at a spacing which approximately corresponds to the height of the sheets 34, 35.

In this manner, a space enclosed by the two bottom walls 2 and 2' and the two sheets 34, 35 is provided between the two U-profile housing 1, 1' arranged in mirror-inverted manner, said space being able to serve to receive further structural and wiring elements. The height of the sheets 34, 35 actually is as desired and can be adapted to the particular purpose of use of the housing combination.

Figure 2:
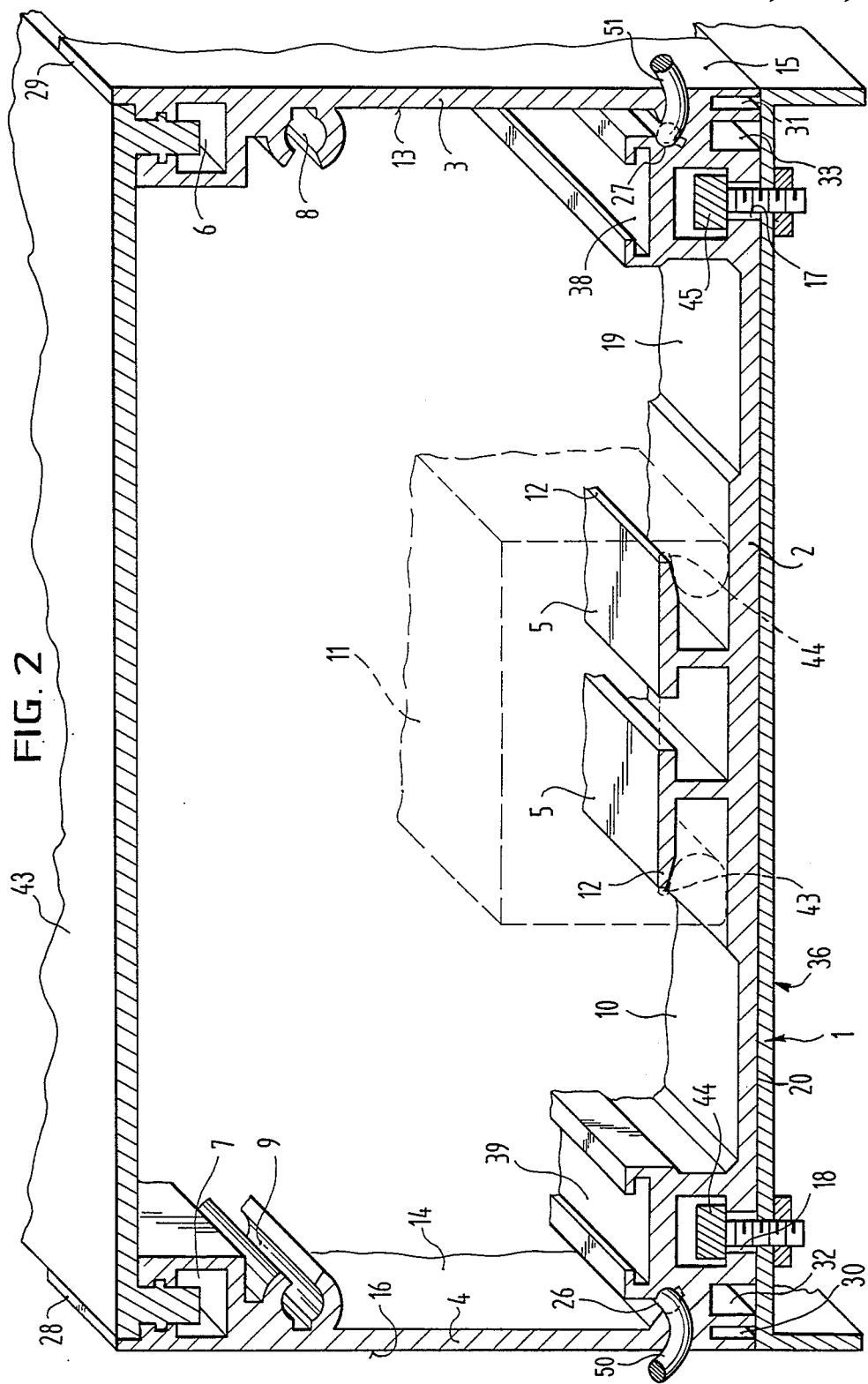
FIG. 2 is a partial sectional enlarged view in perspective of the U-profile housing of FIG. 1.
Figure 4:
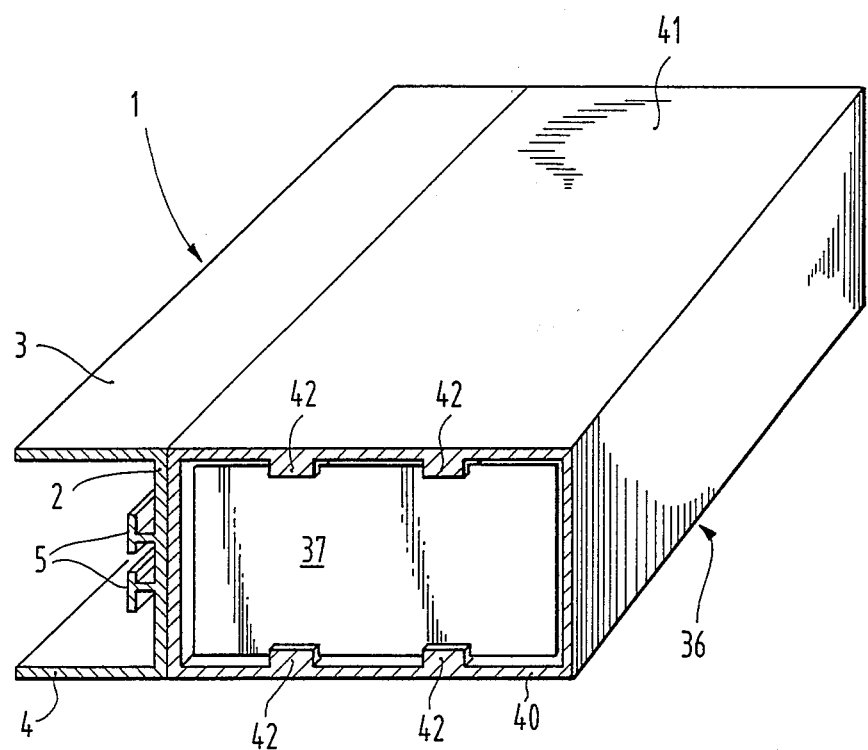

It is to be understood that in the case of the arrangement shown in FIG. 3 the two U-profile housings 1, 1' that are connected together are shown only diagrammatically. Hence, most of the details of the profile designs to be gathered from FIG. 2 have been omitted, such as e.g. the assembly depressions 19 disposed on the inner side 10 of the bottom wall 2 between the two parallel profile rails 5 arranged in its center and the outer edges, and inner base wall portions bounding passageways 38 and 39 are provided laterally adjacent to said depressions, the passageways likewise serving assembly purposes. FIG. 4 shows a further embodiment of the invention, in which the housing 1, which may of course also consist of synthetic material, is mounted on the outer side 20 of its bottom wall 2 to a known slide-in support 36. As shown in FIG. 2, screws 44, 45 have heads mounted in the grooves 17, 18. Screws 44, 45 are connected to support 36. This slide-in support serves to receive printed circuit boards 37 and includes on its side walls 40, 41 the rails 42 required for guiding said printed circuit boards.

Hence, the U-profile housing includes appropriate grooves, particularly in the region of its bottom wall 2. All of the mounting and guiding elements for the parts to be inserted in the housing can also be inserted into similar U-profile housings. The housings can be assembled to known printed circuit board housings, without there being any need for modifying said housing for this purpose due to the provision of additional retaining grooves.

What is claimed is:

1. A structural assembly for interchangeably and supportably mounting electrical components of the type having snap-action mounts, comprising:
   (a) one housing having a generally planar base wall extending along a longitudinal direction, a pair of upright longitudinally-extending side walls extending generally perpendicular to the base wall, a pair of upright end walls extending generally perpendicular to the base wall and generally perpendicular to the side walls, said walls bounding an interior space, and said one housing having an open top in communication with the interior space and through which electrical components are insertable in an insertion direction generally perpendicular to the base wall;
   (b) a pair of longitudinally-extending slide rails spaced transversely apart from each other on the base wall within the interior space, said slide rails having respective snap-fastening elements situated above, and extending generally parallel to, the base wall, said snap-fastening elements being operative for releasably and interchangeably engaging snap-action mounts of electrical components;
   (c) another housing arranged in mirror-symmetrical relationship with said one housing, said other housing having a bottom wall facing the base wall of said one housing at a distance, said base wall and said bottom wall having outer wall portions bounding outwardly-open longitudinally-extending grooves; and
   (d) connecting plates mounted in opposing pairs of grooves on the housings and spanning said distance therebetween.

2. The structural assembly as recited in claim 1, wherein each rail of said one housing has a generally T-shaped cross-section.

3. The structural assembly as recited in claim 1, wherein each snap-fastening element of said one housing has a tapered surface facing the base wall.

4. The structural assembly as recited in claim 1, wherein each housing is a one-piece extrusion.

5. The structural assembly as recited in claim 1, wherein the end walls of said one housing have generally planar ears extending generally parallel to the base wall and located at the open top; and further comprising handles mounted on the ears, for enabling a user to move said one housing from place to place.

6. The structural assembly as recited in claim 1, wherein the side walls of said one housing have top wall portions bounding longitudinally-extending grooves in which a cover plate overlying the open top of said one housing is received.

7. The structural ssembly as recited in claim 1, wherein the side walls of said one housing have side wall portions bounding longitudinally-extending passageways through which elongated fasteners for mounting the end walls on said one housing are received.

8. The structural assembly as recited in claim 1, wherein the side and base walls of said one housing meet at corner wall portions bounding longitudinally-extending wiring grooves in which electrical wiring is routed.

9. The structural assembly as recited in claim 1, wherein the base wall has inner base wall portions bounding raised passages of generally U-shaped cross-section and extending longitudinally of the base wall.

10. The structural assembly as recited in claim 1, wherein the base wall has longitudinally-extending shallow depressions.

11. The structural assembly as recited in claim 1, wherein each housing has a standardized length.

12. A structural assembly for interchangeably and supportably mounting electrical components of the type having snap-action mounts, comprising:
   (a) a housing having a generally planar base wall extending along a longitudinal direction, a pair of upright longitudinally-extending side walls extending generally perpendicular to the base wall, a pair of upright end walls extending generally perpendicular to the base wall and generally perpendicular to the side walls, said walls bounding an interior space, and said housing having an open top in communication with the interior space and through which electrical components are insertable in an insertion direction generally perpendicular to the base wall;
   (b) a pair of longitudinally-extending slide rails spaced transversely apart from each other on the base wall within the interior space, said slide rails having respective snap-fastening elements situated above, and extending generally parallel to, the base wall, said snap-fastening elements being operative for releasably and interchangeably engaging snap-action mounts of electrical components; and
   (c) a printed circuit board support of parallelepiped configuration and mounted on and extending along the base wall of the housing, said support bounding an interior chamber and having therein longitudinally-extending guide rails along which at least one printed circuit board is slidably mounted.

* * * * *